United States Patent [19]
Yoshimura et al.

[11] Patent Number: 5,489,795
[45] Date of Patent: Feb. 6, 1996

[54] SEMICONDUCTOR INTEGRATED CIRCUIT DEVICE HAVING DOUBLE WELL STRUCTURE

[75] Inventors: Hisao Yoshimura, Poughkeepsie, N.Y.; Takeo Maeda, Tokyo; Masakazu Kakumu, Kawasaki, both of Japan

[73] Assignee: Kabushiki Kaisha Toshiba, Kanagawa, Japan

[21] Appl. No.: 317,835

[22] Filed: Oct. 4, 1994

Related U.S. Application Data

[63] Continuation of Ser. No. 105,890, Aug. 11, 1993, abandoned.

[30] Foreign Application Priority Data

Aug. 11, 1992 [JP] Japan .................................... 4-235372

[51] Int. Cl.⁶ .......................... H01L 29/76; H01L 29/94; H01L 31/062
[52] U.S. Cl. .......................... 257/369; 257/371; 257/402; 257/345
[58] Field of Search .................................... 257/369, 371, 257/402, 345

[56] References Cited

FOREIGN PATENT DOCUMENTS

| 0209166 | 1/1987 | European Pat. Off. | 257/345 |
| 0317257 | 5/1989 | European Pat. Off. | 257/345 |
| 3198282 | 1/1993 | Japan | 257/369 |

OTHER PUBLICATIONS

European Search Report, Jul. 7, 1994.
"1991 Symposium on VLSI Technology", Digest of Technical Papers, IEEE Cat. No. 91 ch 3017-1, May 28–30, 1991/OISO.
"Simultaneous Definition and Implant of N–Well and P–Channel Source/Drain", IBM Technical Disclosure Bulletin, vol. 29, No. 10, Mar. 1987.
Mizuno, Tomohisa, et al., "High Performance Shallow Junction Well Transistor (SJET)", Technical Digest of the Symposium of VLSI Technology (1992), pp. 109–110.

Yoshimura, Hisao, et al., "New CMOS Shallow Junction Well FET Structure (CMOS–SJET) for Low Power–Supply Voltage", IEDM Technical Digest (1992), pp. 909–912.

*Primary Examiner*—Steven H. Loke
*Attorney, Agent, or Firm*—Loeb and Loeb

[57] ABSTRACT

A semiconductor device has a first P type well region (11) formed on an N type semiconductor substrate (10) and a second N type well region (12) formed so as to enclose the first well region. A third N type well region (13) formed on the semiconductor substrate is enclosed by a fourth P type well region (14). The first well region adjoins and is electrically connected to the fourth well region. Contact regions (15, 16) are formed on the first and third well regions to apply a bias voltage to the PN junction between the first and third well regions. An NMOS FET is formed in the first well region and a PMOS FET is formed in the third well region. The drain currents of the NMOS FET and PMOS FET are controlled by changing the reverse bias voltage applied to the two contact regions (15, 16). The depth of the first well region (11) is such that a depletion layer extending below the NMOS FET gate electrode (50) can be connected to a depletion layer formed at an interface between the first and second well regions. The depth of the third well region is such that a depletion layer extending below the gate electrode (5) of the PMOS FET can be connected to a depletion layer formed at the interface between the third and fourth well regions.

6 Claims, 8 Drawing Sheets

SEMICONDUCTOR INTEGRATED CIRCUIT DEVICE HAVING DOUBLE WELL STRUCTURE

This is a continuation of application Ser. No. 08/105,890, filed Aug. 11, 1993, now abandoned.

BACKGROUND OF THE INVENTION

1. Field of the Invention

The present invention relates to a semiconductor integrated circuit device having transistors of CMOS structure, and a method of manufacturing the same semiconductor integrated circuit device.

2. Description of the Background Art

With the remarkable advance of semiconductor circuit devices (i.e., ICs and LSIs) to higher density and higher integration, recently, the semiconductor elements have been miniaturized more and more. For higher integration, although MOS FETs (Metal-Oxide-Semiconductor Field Effect Transistors) are advantageous, the power consumption within the chip also increases with increasing integration of the semiconductor integrated circuit device. Accordingly, CMOS devices having CMOS (Complementary MOS) structure FETs is suitable when a higher integration and a lower power consumption are both required.

Figure 9:
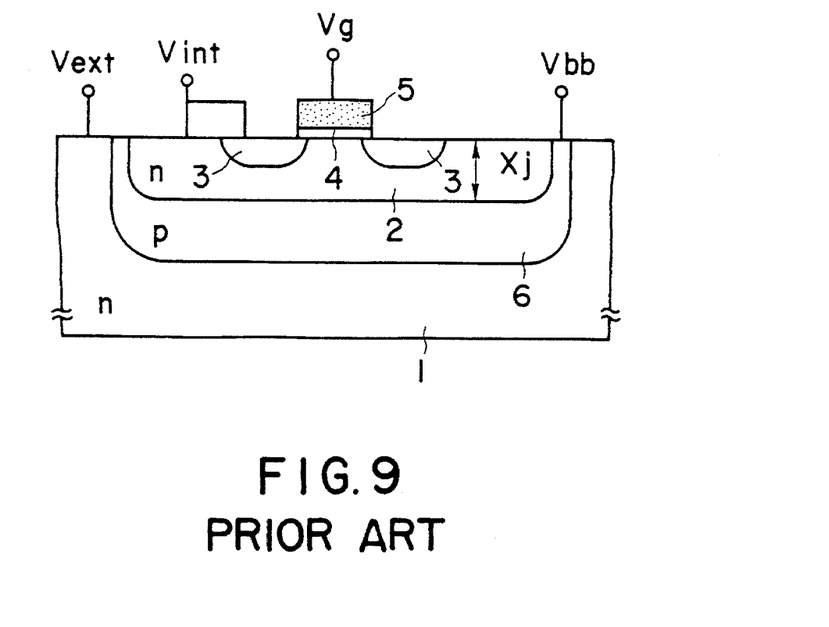
FIG. 9 is a cross-sectional view showing the conventional semiconductor integrated circuit device.

To further miniaturize the semiconductor elements, a MOS FET of the structure as shown in FIG. 9 is conventionally proposed (as disclosed in Japanese Patent Laid-open No. 21730/1993 relating to Japanese Patent Application No. 198282/1991). This semiconductor element is preferably applied to a CMOS semiconductor integrated circuit, for instance. This element is formed on an N-type silicon semiconductor substrate 1 whose impurity concentration is about $2\times10^{15}$ cm$^{-3}$. The MOS FET is arranged in a double impurity diffusion region (referred to as a well, hereinafter) formed on the semiconductor substrate 1. Although not shown, other elements are formed directly in the semiconductor substrate or in other wells or other double wells.

The method of manufacturing the above-mentioned conventional semiconductor device (MOS FET) will be described hereinbelow: first boron ions are injected into the semiconductor substrate 1 with the use of a mask (not shown). The substrate is then heat-treated for several hours at about 1190° C. to form a deep P well 6 with a depth (from the substrate surface) of about 5 μm and a peak impurity concentration of about $6\times10^{16}$ cm$^{-3}$. Thereafter, phosphorous ions are further injected into the substrate 1. The substrate is then heat-treated for several hours to form a shallow N well 2 with a junction depth Xj (which is defined as a depth from the substrate surface) of about 1.0 μm and a peak impurity concentration of about $6\times10^{17}$ cm$^{-3}$. Furthermore, element isolation regions (not shown) are formed on the surface of the semiconductor substrate 1 at interfaces between the semiconductor substrate 1 and the N well 2 and between the substrate 1 and the P well 6 in accordance with a selective oxidation technique such as LOCOS (localized Oxidation of Silicon). Then, a gate oxide film (SiO$_2$) 4 with a thickness of 40 to 50 nm is deposited on the central surface portion of the N well 2. Next, boron ions are injected into the semiconductor substrate 1 through the oxide film 4 to control the threshold voltage ($V_{th}$) of the MOS FET. Furthermore, a polycrystalline silicon (polysilicon hereinafter) film, for instance is deposited on the gate oxide film 4; phosphorus ions are diffused into the polysilicon film and further patterned to obtain a gate electrode 5. Further, boron ions are injected into the semiconductor substrate 1 from both sides of the gate electrode 5 and then thermally diffused to form a p$^+$ source/drain region 3 whose impurity concentration of about $1\times10^{21}$ cm$^{-3}$.

In the MOS FET formed as described above, an internal supply voltage ($V_{int}$) of 4 V is applied to the N well 2; a constant voltage $V_{bb}$ (−2 V) is applied to the P well 6; and a gate voltage $V_g$ is applied to the gate electrode 5. Further, a reverse bias voltage is applied to the two wells from the outside using the external contact $V_{ext}$ to control the operation of the MOS FET. This is because the capacity at a PN junction formed between the two wells can be controlled by a reverse bias voltage applied to the PN junction between the two wells.

In the conventional semiconductor integrated circuit, device of CMOS structure, the depth of the wells (both N and P wells) is 2 μm or more from the surface of the semiconductor substrate; that is, the depth is about 4 to 5 μm. In contrast, in the case of the structure formed with the shallow well 2 as shown in FIG. 9, the drain current increases as compared with other conventional circuit devices, and further the depletion layer capacitance under the channel region is coupled to the reverse bias capacitance between the N well 2 and the P well 6, with the result that the depletion layer becomes thicker than that obtained by a gate voltage applied and thereby the MOSFET can be activated substantially at a lower voltage.

However, in the conventional MOS FET of the structure, as shown in FIG. 9, in which the two wells are simply made shallow to miniaturize the semiconductor integrated circuit device, it is necessary to provide external electrodes for applying a voltage from the outside to the well region at which the MOS FET is formed, to the semiconductor substrate which forms a junction to this well region or to another well region which encloses this well region. In the case of the double well structure as shown in FIG. 9, on the other hand, since the well regions must be formed as shallow as possible for miniaturization, the outside well 8 must be formed as close as possible to the inside well 2 and therefore the outside well 6 cannot be substantially exposed on the surface of the semiconductor substrate 1, with the result that there arises a problem in that an open area at which the external electrode can be formed will not be obtained on the outside well 6.

SUMMARY OF THE INVENTION

Accordingly, the object of the present invention is to provide a semiconductor integrated circuit device, in which the depth of the well region just under the channel of each MOS FET from the surface of the semiconductor substrate surface is determined to be shallow so that an operational characteristics of the MOS FET can be controlled by the bias voltage applied to the well region; and further the external electrodes for applying the bias voltage are located appropriately. Further, the present invention provides a method of manufacturing the same semiconductor integrated circuit device as described above.

According to the present invention, there is provided a semiconductor integrated circuit device, comprising:

a semiconductor substrate of a first conductive type;

a first well region of a second conductive type, formed on said semiconductor substrate;

a second well region of the first conductive type, formed on said semiconductor substrate so as to enclose said first well region;

a third well region of the first conductive type, formed on said semiconductor substrate;

a fourth well region of the second conductive type, formed on said semiconductor substrate so as to enclose said third well region;

a first conductive type MOS field effect transistor formed in said first well region and having a gate electrode formed on a gate insulating film;

a second conductive type MOS field effect transistor formed in said third well region and having a gate electrode formed on a gate insulating film;

means formed on said first well region and said third well region respectively, for applying a reverse bias voltage; and said first well region being adjoining to said fourth well region; and a depth of said first well region under the gate electrode of said MOS field effect transistor of the first conductive type from a surface of said semiconductor substrate being such that a depletion layer extending from an interface between the gate insulating film of the MOS field effect transistor of the first conductive type and said first well region can be connected to a depletion layer formed at an interface between said first well region and said second well region and further a depth of said third well region under the gate electrode of said MOS field effect transistor of the second conductive type from the surface of said semiconductor substrate being such that a depletion layer extending from an interface between the gate insulating film of the MOS field effect transistor of the second conductive type and said third well region can be connected to a depletion layer formed at an interface between said third well region and said fourth well region.

There is also provided a semiconductor integrated circuit device, comprising:

a semiconductor substrate of a first conductive type;

a first well region of a second conductive type, formed on said semiconductor substrate;

a second well region of the first conductive type, formed on said semiconductor substrate;

a third well region of the second conductive type, formed on said semiconductor substrate so as to enclose said second well region;

a first conductive type MOS field effect transistor formed in said first well region and having a gate electrode formed on a gate insulating film;

a second conductive type MOS field effect transistor formed in said second well region and having a gate electrode formed on a gate insulating film;

means formed on said first well region and said second well region respectively, for applying a reverse bias voltage; and said first well region being adjoining to said third well region; and a depth of said first well region under the gate electrode of said MOS field effect transistor of the first conductive type from a surface of said semiconductor substrate being such that a depletion layer extending from an interface between the gate insulating film of the MOS field effect transistor of the first conductive type and said first well region can be connected to a depletion layer formed at an interface between said first well region and said semiconductor substrate and further a depth of said second well region under the gate electrode of said MOS field effect transistor of the second conductive type from the surface of said semiconductor substrate being such that a depletion layer extending from an interface between the gate insulating film of the MOS field effect transistor of the second conductive type and said second well region can be connected to a depletion layer formed at an interface between said second well region and said third well region.

According to another aspect of the present invention, there is provided a method of manufacturing a semiconductor integrated circuit, comprising the steps of:

forming a second well region of a first conductive type on a semiconductor substrate of the first conductive type;

forming a fourth well region of a second conductive type on the semiconductor substrate adjoining to the second well region;

forming a first well region of the second conductive type in the second well region;

forming a third well region of the first conductive type in the fourth well region adjoining to the first well region, a depth of the third well region from a surface of the semiconductor substrate being shallower than a depth of the first well region from the surface of the semiconductor substrate at an interface between the first and third well regions;

forming a first conductive type MOS field effect transistor in the first well region;

forming a second conductive type MOS field effect transistor in the third well region;

forming means for applying a reverse bias voltage to the first well region and the third well region respectively; and determining a depth of the first well region under the gate electrode of the MOS field effect transistor of the first conductive type from a surface of the semiconductor substrate in such a way that a depletion layer extending from an interface between the gate insulating film of the MOS field effect transistor of the first conductive type and the first well region can be connected to a depletion layer formed at an interface between the first well region and the second well region and further a depth of the third well region under the gate electrode of the MOS field effect transistor of the second conductive type from the surface of the semiconductor substrate in such a way that a depletion layer extending from an interface between the gate insulating film of the MOS field effect transistor of the second conductive type and the third well region can be connected to a depletion layer formed at an interface between the third well region and the fourth well region.

In the semiconductor integrated circuit device of CMOS structure of the present invention, it is possible to provide a semiconductor device of CMOS structure such that the MOS FET can be formed in a well region whose depth is 0.5 μm or less just under the gate electrode from the surface of the semiconductor substrate.

The first well region under the channel region of one MOS FET of the CMOS structure is determined to be shallow, and a second well region is formed outside this first shallow well region so as to form a double well structure. Further, the third well region under the channel region of the other MOS FET of the CMOS structure is determined to be shallow, and a fourth well region is formed outside this third shallow well region so as to form a double well structure. The first well region is connected electrically to the fourth well region. Therefore, it is possible to form an external electrode on the surface of the first well region in order to apply a bias voltage to a junction between the third well region and the fourth well region. In other words, since one of the shallow well regions extends under the other of the shallow well regions, it is possible to form means (contact regions) for applying a reverse bias voltage to the junction between the third and fourth well regions, without providing an external electrode on the other well region, thus allowing the electrodes to be arranged effectively on the semiconductor substrate.

In the structure as described above, the well region just under the gate electrode is depleted in the ordinary gate voltage range. Accordingly, the substantial capacitance of depletion layer can be reduced, so that the sub-threshold characteristics can be improved. In other words, since the threshold voltage can be determined to be low by a lower supply voltage under the condition that the leak current is kept at a low level, it is possible to realize a CMOS circuit low in both voltage and power consumption and high in operation speed. In addition, when a third electrode is provided on the back surface of the semiconductor substrate, it is possible to further decrease the junction capacitance of the source/drain region of the MOSFET and to increase the drain current.

DETAILED DESCRIPTION OF THE PREFERRED EMBODIMENTS

The embodiments of the present invention will be described hereinbelow with reference to the attached drawings.

Figure 1:
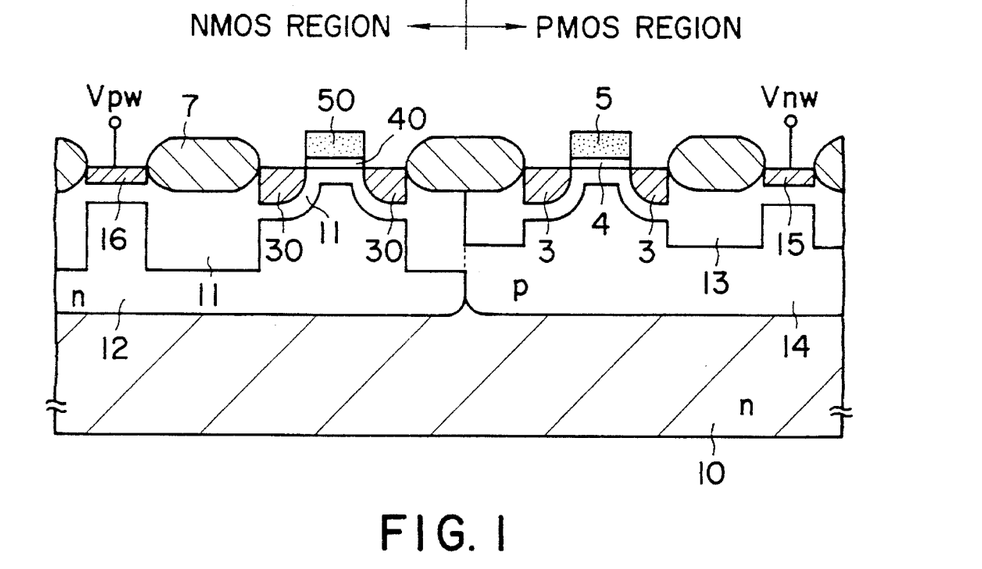
FIG. 1 is a cross-sectional view showing elements of a first embodiment of the semiconductor integrated circuit device of CMOS structure according to the present invention.

FIG. 1 shows the elements of the semiconductor integrated circuit device of CMOS structure according to the present invention. A first well region 11, a second well region 12, a third well region 13 and a fourth well region 14 are formed on an N type silicon semiconductor substrate 10 whose specific resistance is about 1 to 2 Ωcm. The first well region 11 is a P well in which an NMOS FET is formed, and the third well region 13 is an N well in which a PMOS FET is formed. The second well 12 is of N well formed so as to enclose the first P well 11. In this second well 12, however, there exists no region exposed on the surface of the semiconductor substrate 10. In the same way, the fourth well 14 is of P well formed so as to enclose the third N well 13. In this fourth well 14, however, there exists no region exposed on the surface of the semiconductor substrate 10.

The NMOS FET is formed in an activation region of the P well 11 enclosed by a field oxide film 7. This NMOS FET is provided with an N type source/drain region 30. A gate oxide film ($SiO_2$) 40 is formed on the channel region enclosed by this N type source/drain region 30, and further a gate electrode 50 is formed on the gate oxide film 40. A P type high concentration contact region 16 is formed in the P well 11 apart from the NMOS FET, and an external electrode $V_{pw}$ is formed at this contact region 16.

The PMOS FET is formed in an active region of the N well 13 enclosed by a field oxide film 7. This PMOS FET is provided with a P type source/drain region 3. A gate oxide film ($SiO_2$) 4 is formed on the channel region enclosed by this P type source/drain region 3, and further a gate electrode 5 is formed on the gate oxide film 4. An N type high concentration contact region 15 is formed in the N well 13 apart from the PMOS FET, and an external electrode $V_{nw}$ is formed at this contact region 15.

The P well 11 and the N well 13 are both shallow wells. In more detail, in this embodiment, the depths of the shallow P well 11 and the shallow N well 13 are both about 0.4 μm from the surface of the semiconductor substrate under the channel regions of the NMOS FET and PMOS FET, respectively. That is, in the present invention, the depth of the shallow wells is determined to be less than 0.5 μm from the surface of the semiconductor substrate. Further, the first shallow well region 11 and the fourth well region 14 are both of P type region, and additionally electrically connected to each other.

The depth of the shallow P well 11 under the gate electrode 50 from the surface of the semiconductor substrate 10 is such that the depletion layer extending from an interface between the surface of the P well 11 and the gate oxide film 40 is in contact with the depletion layer formed at an interface between the P well 11 and the N well 12. Similarly, the depth of the shallow N well 13 under the gate electrode 5 from the surface of the semiconductor substrate 10 is such that the depletion layer extending from an interface between the surface of the N well 13 and the gate oxide film 4 is in contact with the depletion layer formed at an interface between the N well 13 and the P well 14.

As described above, since the external electrode $V_{pw}$ can be formed at the other regions without providing the external electrodes $V_{pw}$ in the PMOS region on the surface of the semiconductor surface, it is possible to effectively utilize the surface area of the semiconductor substrate.

In the above-mentioned MOS FET formed with the shallow well 11, it is possible to further increase the operation speed of the semiconductor device by applying a potential to the semiconductor substrate 10. In FIG. 1, for instance, the semiconductor device can be operated at higher speed by reducing the junction capacitance of the NMOS FET, when a potential is applied not only between the external electrodes $V_{pw}$ and $V_{nw}$ formed on the surface of the semiconductor substrate 10 but also between the semiconductor substrate 10 and the N well 12 just under the NMOS region. In comparison with the above-mentioned structure, in the conventional semiconductor integrated device of CMOS structure, only the P well and the N well can be biased. Further, even if the P well and N well are biased reversely, since the threshold voltage increases due to the back gate effect, the operation speed of the circuit cannot be improved.

In the semiconductor integrated device according to the present invention, however, when the electrodes are formed on the reverse surface of the semiconductor substrate and a reverse bias voltage is applied to the semiconductor substrate through these electrodes, for instance, it is possible to increase the drain current of the NMOS FET and further to decrease the junction capacitance of the source/drain region of the NMOS FET, with the result that the operation speed of the CMOS circuit can be improved.

Figure 6:
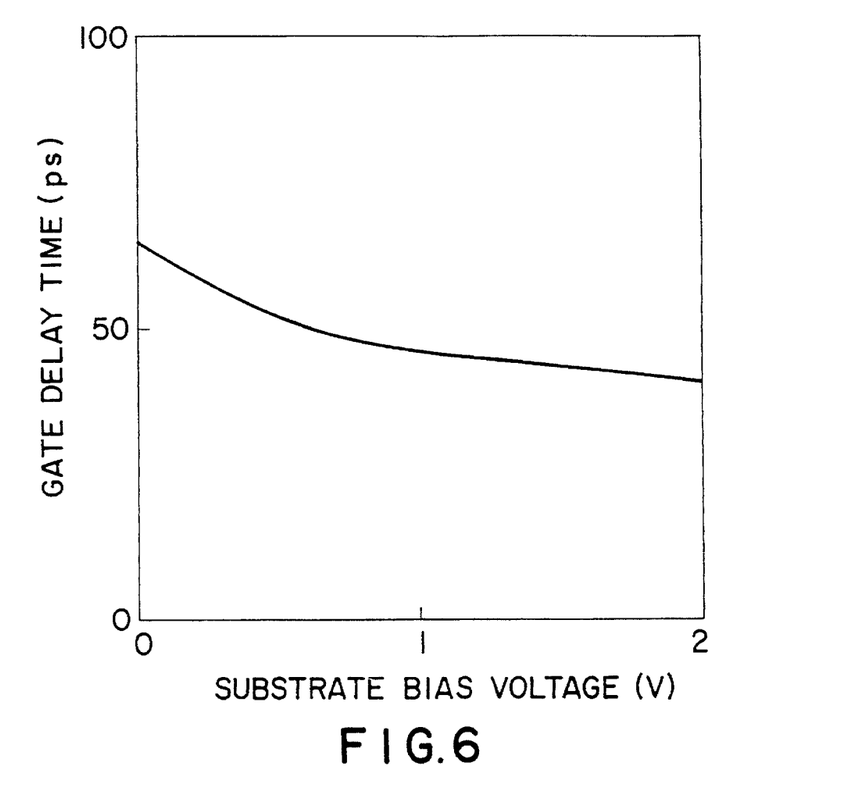
FIG. 6 is a graphical representation showing the dependency of the gate delay time upon the substrate bias voltage, for assistance in explaining the effect of the present invention.

FIG. 6 shows the dependence of the gate delay time of a CMOS ring oscillator upon the substrate bias voltage, in which the gate delay time (ps) is taken on the ordinate and the substrate bias voltage (V) is taken on the abscissa. FIG. 6 indicates that it is possible to improve the gate delay time by applying a bias voltage to the substrate. Further, in the characteristics shown in FIG. 6, the gate length of the MOS FET is 0.35 μm and the supply voltage is 2.5 V.

Figure 7:
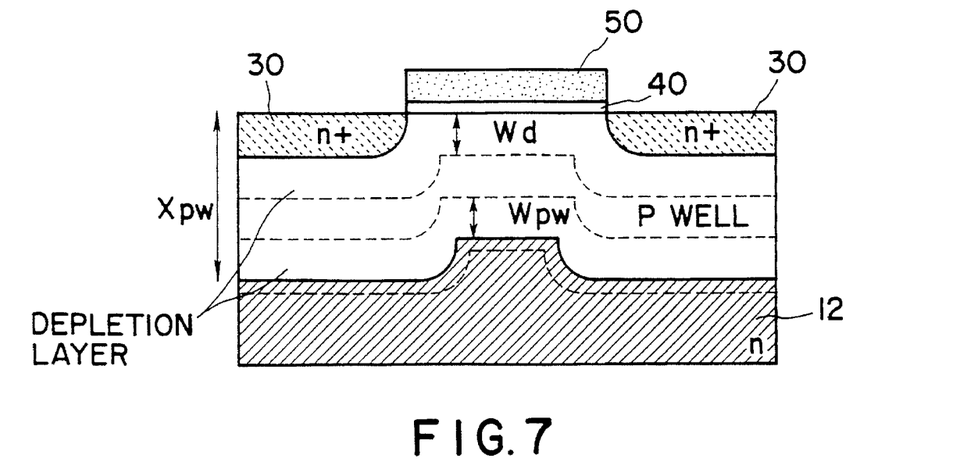
FIG. 7 is a partial cross-sectional view showing the vicinity of the gate on the semiconductor substrate, for assistance in explaining the operation of the present invention.

The semiconductor integrated circuit device according to the present invention is characterized in that the well regions just under gate electrodes are perfectly depleted. For this purpose, the depth of the well region just under the gate electrode from the surface of the semiconductor substrate is set to 0.5 μm or less as already described. This is described in more detail as follows:

FIG. 7 shows the semiconductor substrate in the vicinity of the gate electrode 50. In order to connect the depletion layer just under the gate oxide film 40 to the depletion layer between the well 11 and the well 12 (or substrate), the depth $X_{pw}$ of the shallow P well 11 from the surface of the substrate must be smaller than an addition of the depletion width $W_d$ just under the gate oxide film 40 and the depletion width $W_{pw}$ between the P well 11 (at the portion extending to the shallower side) and the N well 12; that is, $X_{pw} \leq W_d + W_{pw}$.

Figure 8:
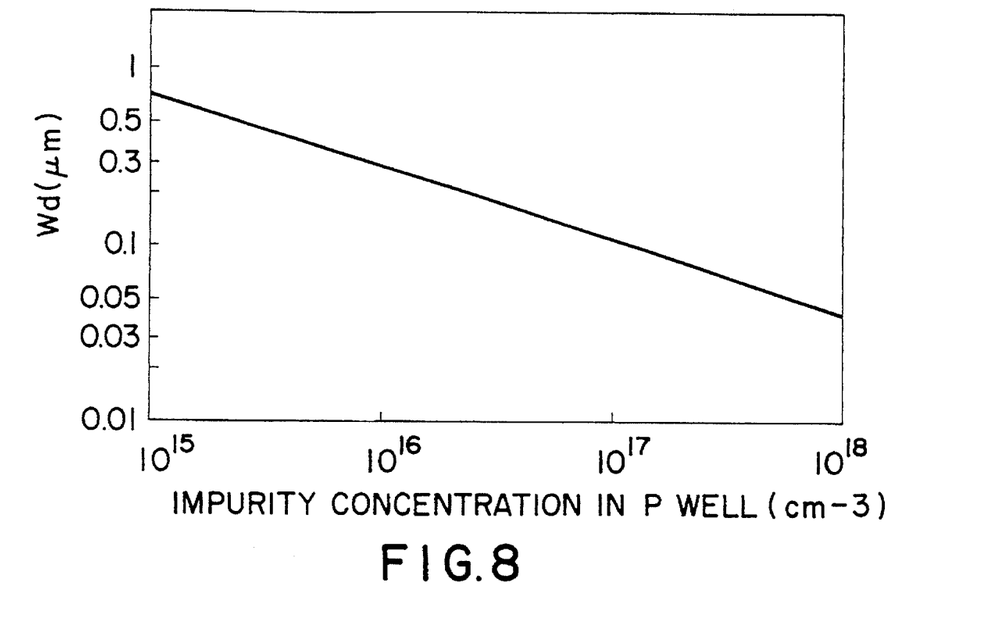
FIG. 8 is a graphical representation showing the dependence of the width the depletion layer just under the gate upon the impurity concentration in the P well.

The depletion layer width $W_d$ just under the gate is dependent upon the impurity concentration in the P well 11, as shown by the characteristics in FIG. 8. In the present invention, the impurity concentration of the P well region 11 just under the gate is $1 \times 10^{16}$ cm$^{-3}$ or more, so that the depth $X_{pw}$ of the P well region 11 from the surface of the substrate must be 0.5 μm or less under consideration of the margin. In FIG. 8, the ordinate indicates the depletion width $W_d$ (μm) just under the gate and the abscissa indicates the impurity concentration (cm$^{-3}$) of the P well region 11 just under the gate.

The method of manufacturing the first embodiment of the semiconductor integrated circuit device according to the present invention will be described hereinbelow with reference to FIGS. 2A to 2E.

Figure 2A:
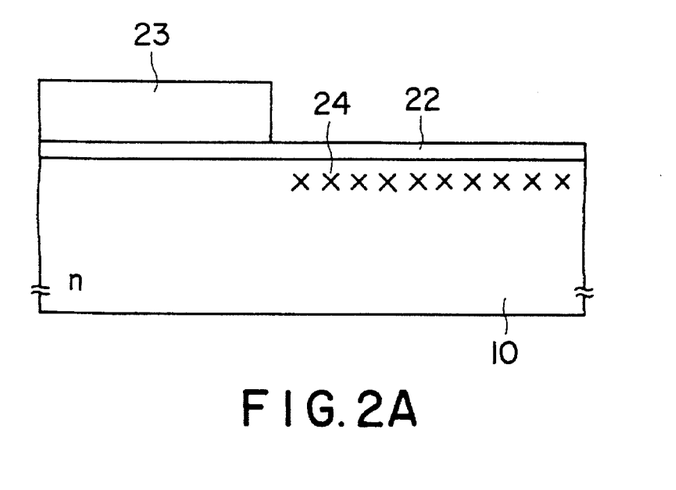
FIGS. 2A to 2E are cross-sectional views showing steps of a manufacturing process of the elements of the semiconductor integrated circuit device shown in FIG. 1.

First, an N type (100) silicon semiconductor substrate 10 with a specific resistance of 1 to 2 Ω-cm is oxidized within an oxidizing atmosphere at about 1000° C. to form a silicon oxide film 22 with a thickness of about 15 nm on the surface of the semiconductor substrate as a protective film. Thereafter, a resist pattern 23 is formed in accordance with the well-known photo-etching method. Boron ions 24 are injected into a PMOS transistor forming region with the resist pattern 23 as a mask at an acceleration voltage of 160 KeV and at a dose of about $4 \times 10^{13}$ cm$^{-2}$, as shown in FIG. 2A.

Figure 2B:
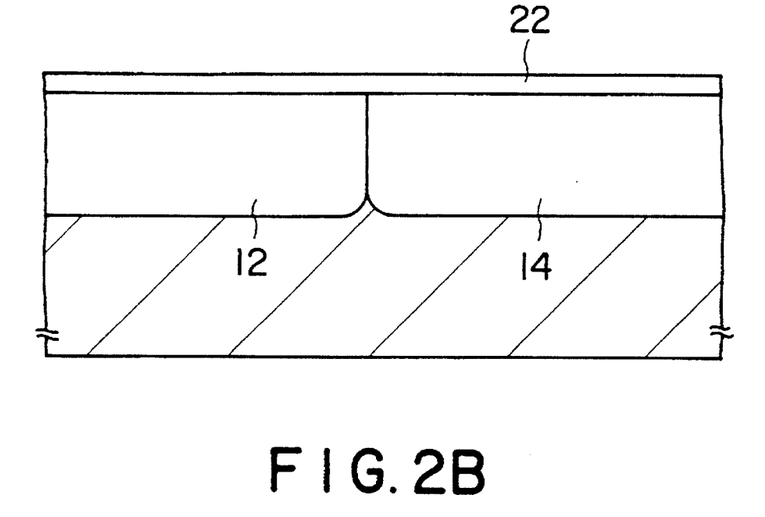

After the resist pattern 23 has been removed, the substrate 10 is annealed within a nitriding atmosphere at about 1190° C. to form a P type impurity diffusion region 14 with a thickness of about 3 μm. This P type impurity diffusion region 14 is used as a deep P well 14. Thereafter, an N type impurity diffusion region 12 with a thickness of about 3 μm is formed adjoining to of the deep P well 14. This N type impurity diffusion region 12 is used as a deep N well 12. In the same way as the P well 14, impurity (e.g., phosphorus) ions are injected and the injected impurity ions are thermally diffused, as shown in FIG. 2B.

Figure 2C:
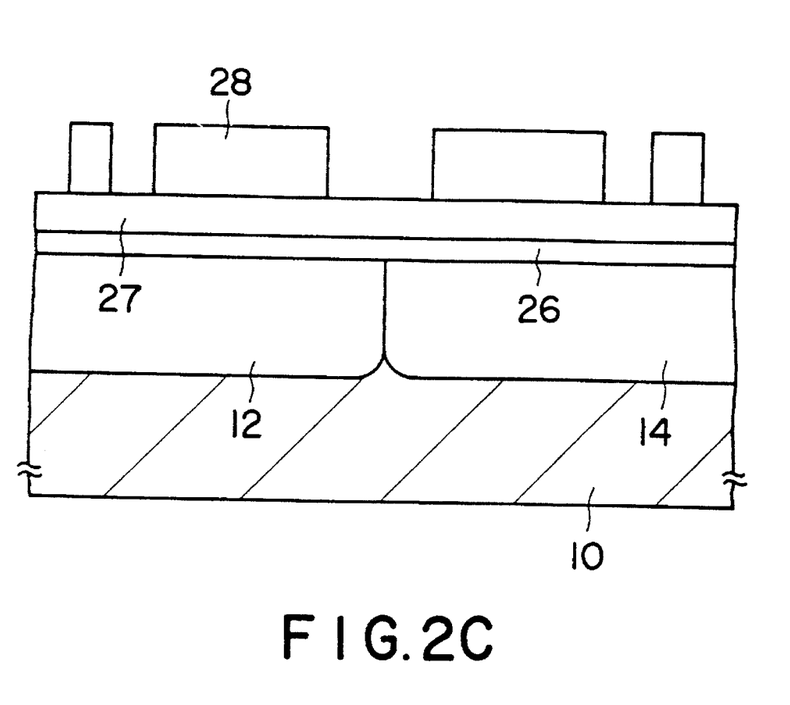

Further, after the silicon oxide film 22 has been removed by a hydrofluoric acid solvent, the surface of the semiconductor substrate 10 is oxidized within an oxidizing atmosphere at about 900° C. to a depth of about 500 Angstrom (Å) to form a second silicon oxide film 26. Further, a silicon nitride film ($Si_3N_4$) 27 with a thickness of about 150 nm, for instance is deposited on the second silicon oxide film 26 in accordance with the chemical vapor deposition (CVD) technique. Thereafter, a second resist pattern 28 is formed in accordance with the photo etching method, as shown in FIG. 2C.

With the formed second resist pattern 28 as a mask, the silicon nitride film 26 is selectively removed in accordance with the RIE (reactive ion etching) technique to form an element isolating region (a field oxide film) 7. Further, after the resist pattern 28 has been removed, a new resist pattern (not shown) is formed, and boron ions are injected into a region under the element isolating region 7 for the NMOS forming region with the new resist pattern as a mask at an acceleration voltage of 160 KeV and at a dose of $1 \times 10^{13}$ to $1 \times 10^{14}$ cm$^{-2}$. After the resist pattern has been removed another new resist pattern (not shown) is formed, and phosphorus ions are injected into a region under the element isolating region 7 for the PMOS forming region with the new resist pattern as a mask at an acceleration voltage of 150 KeV and at a dose of $5 \times 10^{12}$ to $2.5 \times 10^{13}$ cm$^{-2}$. Further, after the resist pattern has been removed, the substrate is oxidized within the oxidizing atmosphere at about 1000° C. to form a silicon oxide film 7 (which becomes a field oxide film) with a thickness of about 600 nm at the element isolating region forming portion. In this process, simultaneously, boron ions injected under the element isolation region (the field oxide film 7) for the NMOS forming region and phosphorus ions injected under the element isolating region for the PMOS forming region are all activated, so that a P type impurity diffusion region 29 with a thickness of about 0.2 to 2 μm and an N type impurity diffusion region 31 with a thickness of about 0.1 μm or more can be both formed at the regions into which ions are injected.

Figure 2D:
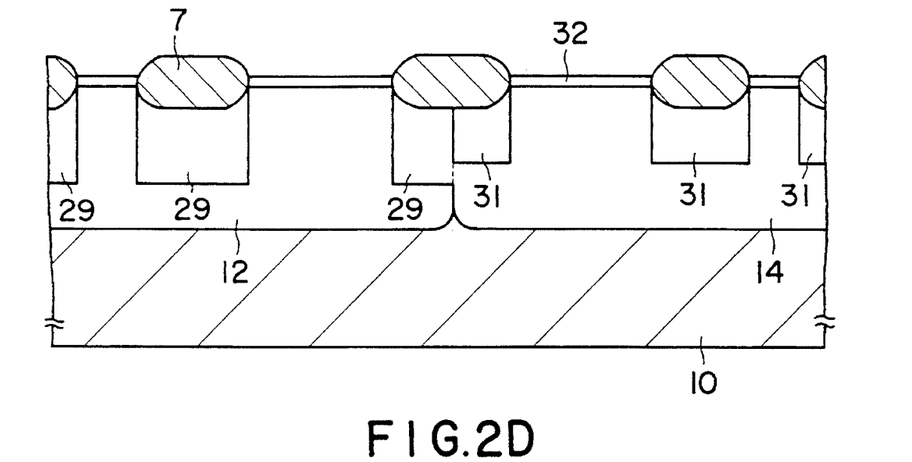

These formed P type impurity diffusion region 29 and N type impurity diffusion region 31 are formed under the field oxide film 7 and used as channel stoppers of the transistors. Successively, the silicon nitride film 27 and the second silicon oxide film 26 are removed, as shown in FIG. 2D.

In this manufacturing process, the thickness of the N type impurity diffusion region 31 is smaller than that of the P type impurity diffusion region 29, so that the P type impurity diffusion region 29 can be connected with the deep P well 14 so as to be formed integral therewith. The thickness of the field oxide film 7 is about 0.2 to 0.7 μm, and 0.3 μm in this embodiment.

Successively, the semiconductor substrate 10 is thermally oxidized within the oxidizing atmosphere at 850° C. to form a third silicon oxide film 32 with a thickness of 10 nm on the surface of the element-forming region of the semiconductor substrate 10, and further a polysilicon film with a thickness of about 300 nm is deposited thereon in accordance with the chemical vapor deposition (CVD) technique and in addition a silicide film such as tungsten silicide is deposited thereon to form a polycide. Successively, the silicon oxide film 32 and the polycide film are selectively etched with a resist mask (not shown) patterned by the photo-etching method in accordance with the reactive ion etching technique. A gate oxide film 40 is formed on the N well 12 and a polycide gate electrode 50 is formed on the gate oxide film 40. Similarly, a gate oxide film 4 is formed on the P well 14 and a polycide gate electrode 5 is formed on the gate oxide film 4. As the material of the gate electrodes 50 and 5, it is possible to use various materials such as polysilicon, a refractory metal such as tungsten, a laminated substance of the polysilicon and the refractory metal, silicide, etc. without being limited to only the polycide. The thickness of the gate electrodes 50 and 5 is about 0.1 to 0.4 µm.

Further, boron ions are injected into the NMOS forming region through the gate oxide films 40 with a resist pattern formed by the photo-etching method as a mask at an acceleration voltage of 60 to 200 KeV and at a dose of $1 \times 10^{12}$ to $1 \times 10^{13}$ cm$^{-2}$. After the resist pattern has been removed, another new resist pattern (not shown) is formed, and phosphorus ions are injected through the gate oxide film 4 into the PMOS forming region with the new resist pattern as a mask at an acceleration voltage of 100 to 400 KeV and at a dose of $1 \times 10^{12}$ to $1 \times 10^{13}$ cm$^{-2}$. Further, after the resist pattern has been removed, boron and phosphorus ions injected are activated electrically, to form a shallow P well 34 with a depth of about 0.4 µm from the surface of the semiconductor substrate under the gate electrode 40 within the deep N well 12 and in addition a shallow N well 35 with a depth of about 0.4 µm from the surface of the semiconductor substrate under the gate electrode 4 within the deep P well 14. Successively, the substrate is thermally oxidized within an oxidizing atmosphere at 900° C. to form a silicon oxide film with a thickness of 10 nm on the surface of the substrate. Further, arsenic ions are injected into the source/drain region of the NMOS transistor and the portion at which the high concentration impurity diffusion region is to be formed to obtain a well potential at the PMOS region, with a resist pattern formed by the photo-etching method at an acceleration voltage of 50 KeV and at a dose of about $5 \times 10^{15}$ cm$^{-2}$.

Thereafter, the substrate is annealed within an inert gas atmosphere at 850° C. for 10 min to activate the injected arsenic ions electrically and thereby to form the N type impurity diffusion region. Accordingly, the source/drain region 30 of the NMOS transistor can be formed in the deep N well 12, and the N type impurity diffusion region 37 can be formed in the deep P well 14, respectively. Further, difluoroboron ions are injected into the source/drain region of the PMOS transistor and the portion at which the high concentration impurity diffusion region is to be formed to obtain a well potential at the NMOS region, with a resist pattern formed by the photo-etching method at an acceleration voltage of 40 KeV and at a dose of about $3 \times 10^{15}$ cm$^{-2}$. Further, the substrate is annealed within an inert gas atmosphere at 850° C. for 10 min to activate the injected boron ions electrically and thereby to form the P type impurity diffusion region. Accordingly, the source/drain region 3 of the PMOS transistor can be formed in the deep P well 14, and the P type impurity diffusion region 36 can be formed in the deep N well 12, respectively.

The above-mentioned method is a first process for manufacturing the semiconductor integrated circuit device to which no ions are injected to control the punch through. A second method of manufacturing the semiconductor integrated circuit device formed with a layer for controlling the punch through will be described hereinbelow.

After the dummy gate oxidation and before the gate oxidation, boron ions are injected into the N well 12 at an acceleration voltage of 10 to 100 KeV and at a dose of $1 \times 10^{12}$ to $2 \times 10^{13}$ cm$^{-2}$, and phosphorus ions are injected into the P well 14 at an acceleration voltage of 20 to 200 KeV and at a dose of $1 \times 10^{12}$ to $2 \times 10^{13}$ cm$^{-2}$. Successively, the semiconductor substrate 10 is thermally oxidized within the oxidizing atmosphere at 850° C. to form a third silicon oxide film 32 with a thickness of 10 nm on the surface of the element forming regions of the semiconductor substrate 10, and further a polysilicon film with a thickness of about 300 nm is deposited thereon in accordance with the chemical vapor deposition (CVD) technique and in addition a silicide film such as tungsten silicide is deposited thereon to form a polycide. Successively, the silicon oxide film 32 and the polycide film are selectively etched with a resist mask (not shown) patterned by the photo-etching method in accordance with the reactive ion etching technique. A gate oxide film 40 is formed on the N well 12 and a polycide gate electrode 50 is formed on the gate oxide film 40. Similarly, a gate oxide film 4 is formed on the P well 14 and a polycide gate electrode 5 is formed on the gate oxide film 4. As the material of the gate electrodes 5 and 50, it is possible to use various materials such as polysilicon, a refractory metal such as tungsten, a laminated substance of the polysilicon and the refractory metal, silicide, etc. without being limited to only the polycide. The thickness of the gate electrodes 5 and 50 is about 0.1 to 0.4 µm.

Thereafter, after the resist pattern has been removed, boron and phosphorus ions injected are activated electrically, to form a shallow P well 34 with a depth of about 0.4 µm from the surface of the semiconductor substrate under the gate electrode 40 within the deep N well 12, and further a shallow N well 85 with a depth of about 0.4 µm from the surface of the semiconductor substrate under the gate electrode 4 within the deep N well 14. Successively, the substrate is thermally oxidized within an oxidizing atmosphere at 900° C. to form a silicon oxide film with a thickness of 10 nm on the surface of the substrate. Further, boron ions are injected into the source/drain region of the NMOS transistor with the use of a mask formed by the photo-etching method at an acceleration voltage of 100 to 200 KeV and at a dose of $2 \times 10^{12}$ to $1.5 \times 10^{13}$ cm$^{-2}$. Further phosphorus ions are injected into the source/drain region of the PMOS transistor at an acceleration voltage of 80 to 180 KeV and at a dose of $2 \times 10^{12}$ to $1.5 \times 10^{13}$ cm$^{-2}$ to form the P type impurity diffusion region 38 and the N type impurity diffusion region 39, respectively, as shown in FIG. 2E.

These P type impurity diffusion region 38 and the N type impurity diffusion region 39 can suppress the punch through between the source/drain region and the semiconductor substrate and between the source/drain region and the first N type impurity diffusion region.

Further, arsenic ions are injected into the source/drain region of the NMOS transistor and the portion at which the high concentration impurity diffusion region is to be formed to obtain a well potential of the PMOS region with a resist pattern formed by the photo-etching method at an acceleration voltage of 50 KeV and at a dose of about $5\times10^{15}$ cm$^{-2}$. Further, the substrate is annealed within an inert gas atmosphere at 850° C. for 10 min to activate the injected arsenic ions electrically and thereby to form the N type impurity diffusion region. Accordingly, the source/drain region 30 of the NMOS transistor can be formed in the deep N well 12, and the N type impurity diffusion region 37 can be formed in the deep P well 14, respectively. Further, difluoroboron ions are injected into the source/drain region of the PMOS transistor and the portion at which the high concentration impurity diffusion region is to be formed to obtain a well potential of the NMOS region with a resist pattern formed by the photo-etching method at an acceleration voltage of 40 KeV and at a dose of about $3\times10^{15}$ cm$^{-2}$. Further, the substrate is annealed within an inert gas atmosphere at 850° C. for 10 min to activate the injected boron ions electrically and thereby to form the P type impurity diffusion region. Accordingly, the source/drain region 3 of the PMOS transistor can be formed in the deep P well 14, and the P type impurity diffusion region 36 can be formed in the deep N well 12, respectively.

Figure 2E:
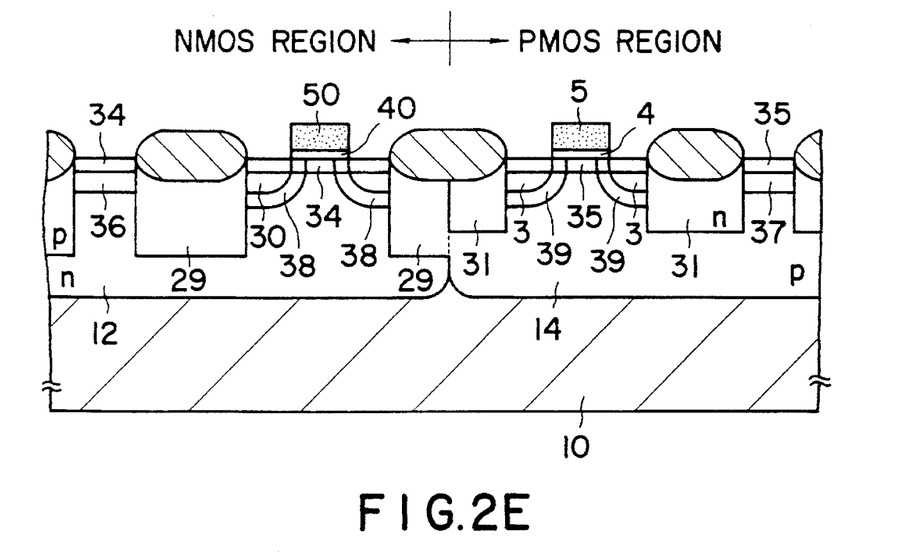

The shallow P well 34, the P type impurity diffusion regions 36 and 38, and the P type impurity diffusion region 29 as shown in FIG. 2E are integrated as the shallow P well (the first well region) 11 as shown in FIG. 1. Further, the first well region is formed integral with the fourth well region (the deep P well) 14 so as to form a single region substantially. The shallow N well 35, the N type impurity diffusion regions 37 and 39, and the N type impurity diffusion region 31 as shown in FIG. 2E are integrated as the shallow N well (the third well region) 13 as shown in FIG. 1. Further, the shallow P well 34 formed in the P type impurity diffusion region 36 becomes the P type high concentration contact region 16 in the first well region 11, and the shallow N well 35 formed in the N type impurity diffusion region 37 becomes the N type high concentration contact region 15 in the third well region 13.

After the above-mentioned process, the semiconductor integrated circuit device of CMOS structure can be completed by the well-known process by forming interlayer insulating films, lead electrodes, a passivation film, etc.

In this embodiment, an oxide film formed in accordance with the LOCOS (localized oxidation of silicon) technique is adopted as the element isolation region. Without being limited thereto, however, the other conventional element isolation structure, for instance such as element isolation regions of trench structure can be applied to the integrated circuit device of the present invention. In the case of the shallow well region formed under the trench, however, since it is difficult to achieve the impurity diffusion through the inside of the trench, it is advantageous to form the trench after the impurity diffusion region (at which the shallow well is to be formed) has been formed. Furthermore, in the first embodiment, although the N type silicon semiconductor substrate with a specific resistance of 1 to 2 Ωcm has been adopted, it is of course possible to use an N type semiconductor substrate formed with an N type or a P type epitaxial growth layer or a P type semiconductor substrate formed with an N type or a P type epitaxial growth layer.

The second embodiment of the semiconductor integrated circuit device according to the present invention will be described hereinbelow with reference to FIGS. 3A to 3D. In the first embodiment, an N type silicon semiconductor substrate has been used. In this second embodiment, a P type silicon semiconductor substrate 10 is used. An N well 41 with a thickness of about 5 μm is formed on the NMOS region forming portion of the semiconductor substrate 10.

Figure 3A:
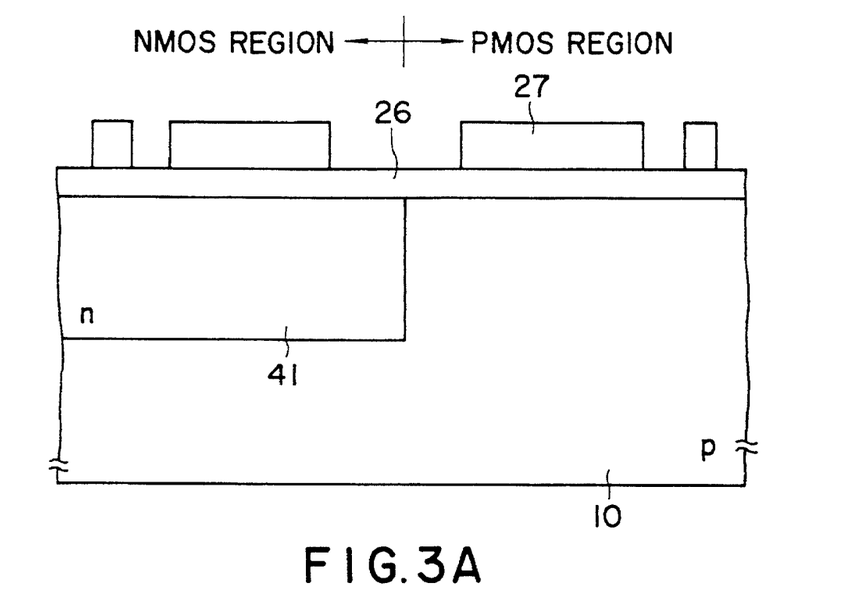
FIGS. 3A to 3D are cross-sectional views showing steps of a manufacturing process of the elements of a second embodiment of the semiconductor integrated circuit device according to the present invention.

To form this N well 41, a resist pattern is first formed by the photo-etching method, and phosphorus ions are injected into the NMOS region forming portion with the resist pattern as a mask (not shown) at an acceleration voltage of 150 KeV and at a dose of about $3\times10^{13}$ cm$^{-2}$ and further diffused within a nitriding atmosphere at about 1190° C. for 10 hours. Thereafter, in the same way as with the case of the first embodiment, after a silicon oxide film 26 with a thickness of about 50 nm and a silicon nitride film 27 with a thickness of about 150 nm have been formed, the silicon nitride film 27 at which the element isolation region is to be formed is selectively removed with a resist pattern (not shown) formed by the photo-etching method in accordance with anisotropic etching technique, as shown in FIG. 3A.

Successively, after the resist pattern has been removed, a new resist pattern is formed, boron ions are injected into the element isolation region of the NMOS forming portion at an acceleration voltage of 100 KeV and at a dose of about $1\times10^{14}$ cm$^{-2}$; and phosphorus ions are injected into the element isolation region of the PMOS forming portion at an acceleration voltage of 360 KeV and at a dose of about $5\times10^{13}$ cm$^{-2}$. Thereafter after the resist pattern has been removed, the substrate is oxidized within an oxidizing atmosphere at 1000° C. to form a field oxide film 7 at the element isolation region forming portion.

Figure 3B:
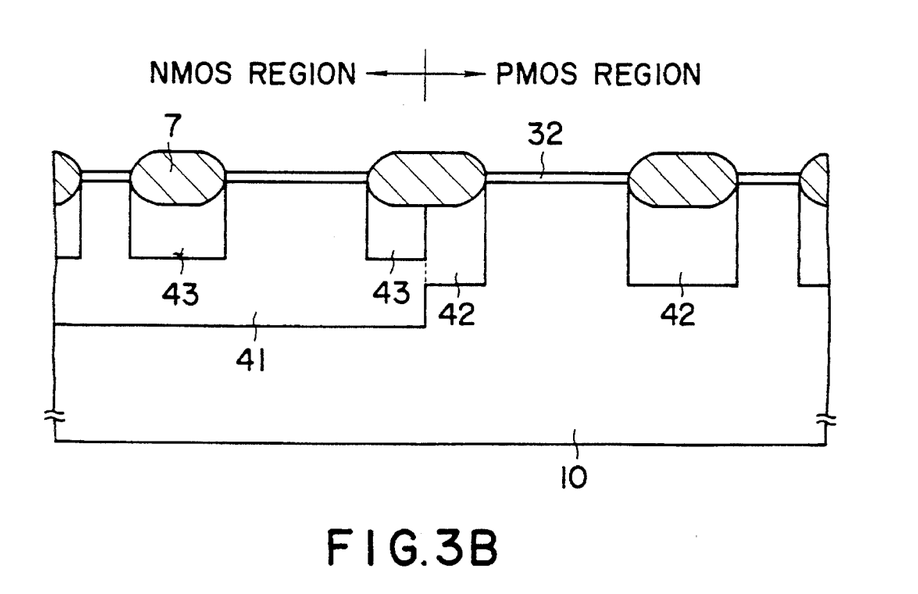

In this process, boron ions injected into the element isolation region of the NMOS region and phosphorus ions injected into the element isolation region of the PMOS region are activated, so that P type impurity diffusion region 43 and N type impurity diffusion region 42 can be formed. In this case, since the thickness of the N-type impurity diffusion region 42 is determined to be larger than that of the P type impurity diffusion region 43, it is possible to connect the N well 41 to the N type impurity diffusion region 42, as shown in FIG. 3B.

Figure 3C:
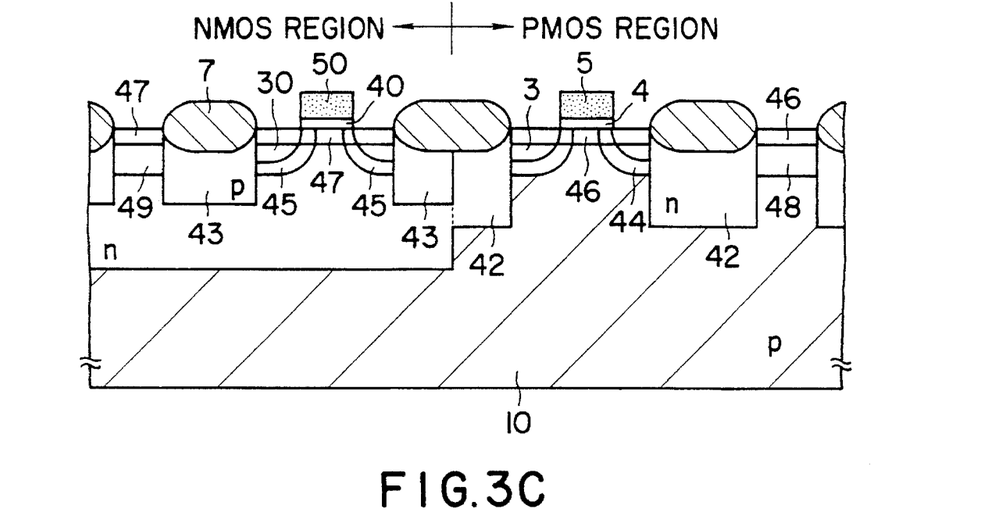

The process after the above-mentioned process is the same as with the case of the first embodiment. That is, an NMOS transistor can be formed in the deep N well 41 so as to include the P type impurity diffusion region 43 formed under the field oxide film 7, the P type impurity diffusion region 49 formed together with the P type source/drain region 3, the shallow P well 47, the P type impurity diffusion region 45 for suppressing punch through, the N type source/drain region 30, the gate oxide film 40 formed thereon, and the gate electrode 50 also formed thereon. Further, a PMOS transistor can be formed in the semiconductor substrate 10 so as to include the N type impurity diffusion region 42 formed under the field oxide film 7, the shallow N well 46, the N type impurity diffusion region 44 for suppressing punch through, the N type impurity diffusion region 48 formed together with the N type source/drain region 30, the P type source/drain region 3, the gate oxide film 4 formed thereon, and the gate electrode 5 also formed thereon, as shown in FIG. 3C.

Figure 3D:
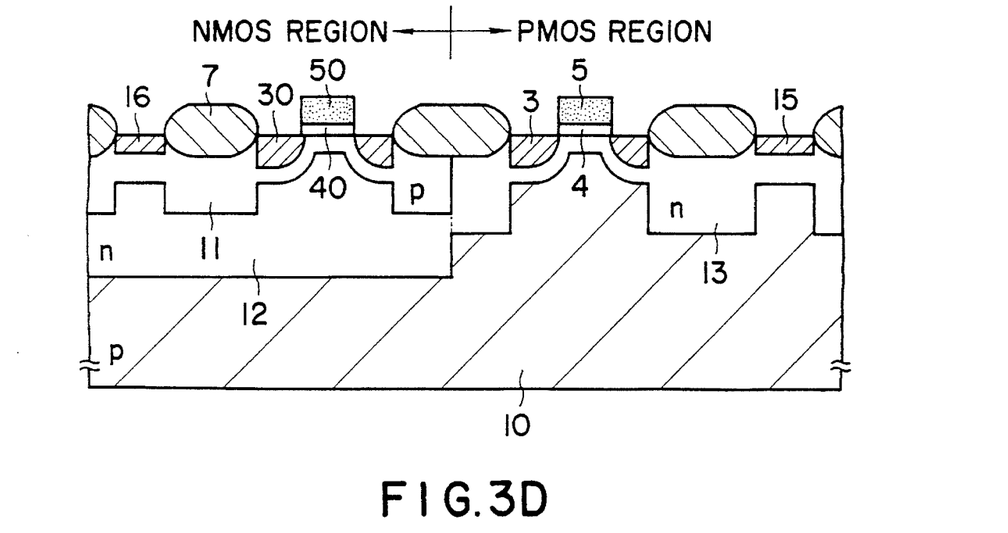

As shown in FIG. 3D, the shallow P well 47 and the P type impurity diffusion regions 43, 45 and 49 become a single shallow P well (the first well region) 11. Further, the shallow N well 48 and the N type impurity diffusion regions 42, 44 and 48 become a single shallow N well (the third well region) 13. The third well region 13 is integrated with the second well region (the deep N well) 12 as a single region substantially. The deep N well is the same as the second well region 12 as shown in FIG. 1. The shallow P well 47 formed in the P type impurity diffusion region 49 shown in FIG. 3C becomes the P type high concentration contact region 18 same as that shown in FIG. 1. Similarly, the shallow N well 46 formed in the N type impurity diffusion region 48 shown in FIG. 3C becomes the N type high concentration contact region 15 shown in FIG. 1, as shown in FIG. 3D.

After the above-mentioned process, the semiconductor integrated circuit device of CMOS structure can be completed by the well-known process by forming interlayer insulating films, lead electrodes, a passivation film, etc.

In the above-mentioned embodiment as shown in FIG. 1 for instance, the structure is characterized in that: the first region 11 and the fourth region 14 are connected to each other so as to constitute one region; the first region (the shallow P well) 11 is formed in the second region (the deep N well) 12 and the third region (the shallow N well) 13 is formed in the fourth region (the deep P well) 14 being adjoining to the second region 12; and the two P type and N type impurity diffusion regions 29 and 31 (shown in FIG. 2D) both formed at the interface region between the second and fourth regions 12 and 14 are different from each other in depth from the surface of the semiconductor substrate. Further, the structure of the present invention can be achieved by the presence of this depth difference between the two adjoining impurity diffusion regions 29 and 31. These two adjoining impurity diffusion regions 29 and 31 are both formed under the field oxide film 7 as a channel stopper region. The difference in depth between the two is preferably 0.1 to 0.5 µm.

Further, in the second embodiment, the element isolation regions are formed by an oxide film formed in accordance with the LOCOS (localized oxidation of silicon) technique. Without being limited thereto, however, the same structure can be obtained when buried element isolation regions are adopted.

Figure 4:
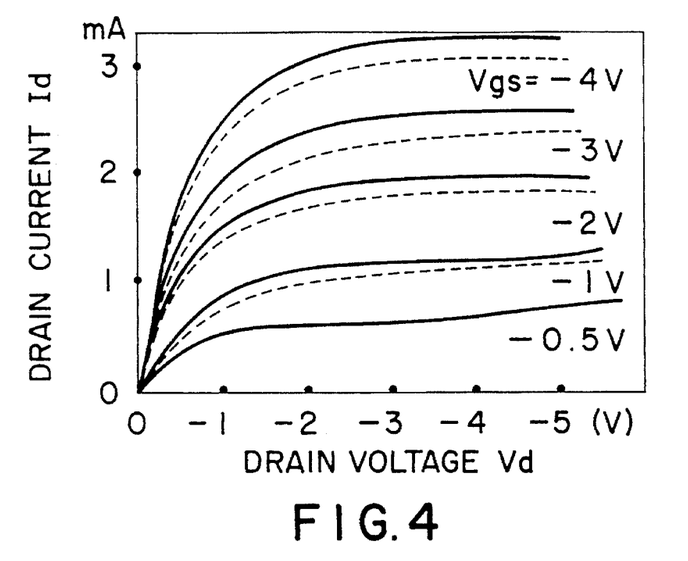
FIG. 4 is a graphical representation showing the drain current and the drain voltage characteristics, for assistance in explaining the effect of the present invention.
Figure 5:
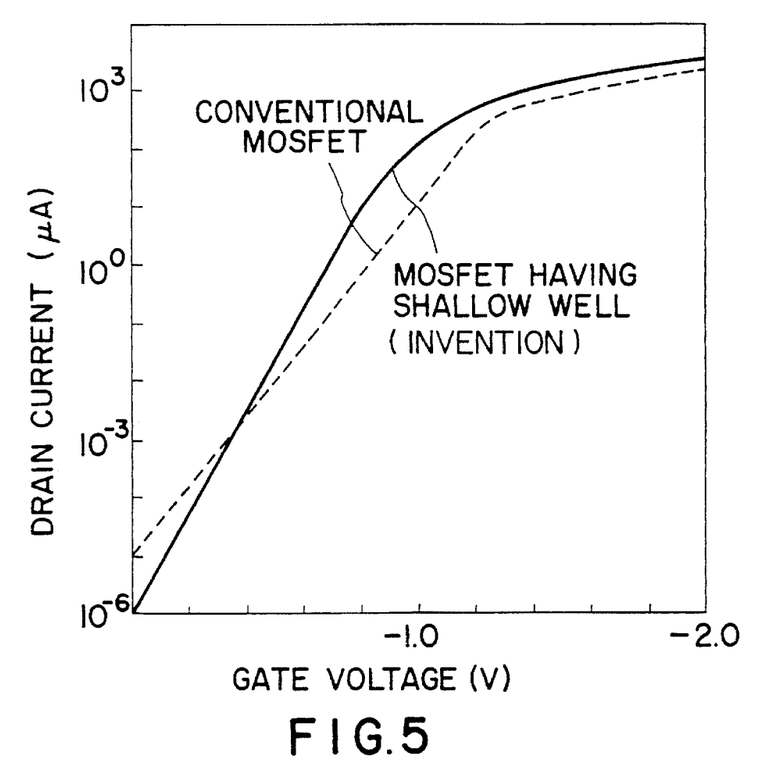
FIG. 5 is a graphical representation showing the drain current and the gate voltage characteristics, for assistance in explaining the effect of the present invention.

FIGS. 4 and 5 show the characteristics of the MOS FET formed with the shallow well according to the present invention, in comparison with those of the conventional MOS FET formed with no shallow well. In the drawing, dashed lines indicate those of the conventional MOS FET without shallow well and the solid lines indicate those of the MOS FET formed with the shallow well of about 0.5 µm or less from the surface of the semiconductor substrate according to the present invention. FIG. 4 is a graph showing the drain current and drain voltage ($I_d$-$V_d$) characteristics, in which the drain voltage $V_d$ is taken on the abscissa; the drain current $I_d$ is taken on the ordinate; and the gate voltages ($V_g$) of −0.5, −1, −2, −3 and −4 V are taken as parameters. FIG. 4 indicates that the drain current of the MOS FET formed with the shallow well of the present invention increases in comparison with the conventional MOS FET with no shallow well. Further, the threshold voltage of the MOS FET of the present invention is about 0.5 V, which is lower than that of the conventional MOS FET of about 1.0 V.

FIG. 5 is a graph showing the sub-threshold current characteristics, in which the drain current (µA) is taken on the ordinate and the gate voltage (V) is taken on the abscissa. FIG. 5 indicates that the sub-threshold coefficient of the MOSFET formed with the shallow well can be improved in comparison with the conventional MOS FET formed with no shallow well. In other words, even if the threshold voltage is reduced, since the leak current at zero bias voltage can be suppressed, it is possible to determine the threshold voltage to be low.

In this case, it is effective to sufficiently reduce the junction depth under the gate electrode in the well region at which the MOS FET is formed.

What is claimed is:

1. A semiconductor integrated circuit device, comprising:

a semiconductor substrate of a first conductive type;

a first well region of a second conductive type, formed on said semiconductor substrate;

a second well region of the first conductive type, formed on said semiconductor substrate so as to form under said first well region;

a third well region of the first conductivity type, formed on said semiconductor substrate;

a fourth well region of the second conductive type, formed on said semiconductor substrate so as to form under said third well region;

a first MOS field effect transistor of the first conductive type formed in said first well region and having a first gate electrode formed on a first gate insulating film;

a second MOS field effect transistor of the second conductive type formed in said third well region and having a second gate electrode formed on a second gate insulating film;

means formed on said first well region and said third well region respectively, for applying a bias voltage; and said first well region being adjoining to said fourth well region; and a depth of said first well region under the first gate electrode of said first MOS field effect transistor of the first conductive type from a surface of said semiconductor substrate being such that a first depletion layer extending from an interface between the first gate insulating film and said first well region is connected to a depletion layer formed at an interface between said first well region and said second well region and further a depth of said third well region under the second gate electrode of said second MOS field effect transistor of the second conductive type from the surface of said semiconductor substrate being such that a second depletion layer extending from an interface between the second gate insulating film and said third well region is connected to a depletion layer formed at an interface between said third well region and said fourth well region.

2. The semiconductor integrated circuit device of claim 1, wherein a field oxide film for isolating elements is formed in said first well region and on said semiconductor substrate; a channel stopper region of the second conductive type is formed in said first well region and under the field oxide film; and the channel stopper region is connected to said fourth well region.

3. The semiconductor integrated circuit device of claim 2, wherein a channel stopper region of the first conductive type is formed in said third well region adjoining to the channel stopper region formed in said first well region; and a depth of the channel stopper region formed in said third well region from the surface of said semiconductor substrate is shallower than a depth of the channel stopper region formed in said first well region from the surface of said semiconductor substrate.

4. A semiconductor integrated circuit device, comprising:

a semiconductor substrate of a first conductive type;

a first well region of a second conductive type, formed on said semiconductor substrate;

a second well region of the first conductive type, formed on said semiconductor substrate;

a third well region of the second conductivity type, formed on said semiconductor substrate so as to form under said second well region;

a first MOS field effect transistor of the first conductive type formed in said first well region and having a first gate electrode formed on a first gate insulating film;

a second MOS field effect transistor of the second conductive type formed in said second well region and having a second gate electrode formed on a second gate insulating film;

means formed on said first well region and said second well region respectively, for applying a bias voltage; and said first well region being adjoining to said third well region; and a depth of said first well region under the first gate electrode of said first MOS field effect transistor of the first conductive type from a surface of said semiconductor substrate being such that a first depletion layer extending from an interface between the first gate insulating film and said first well region is connected to a depletion layer formed at an interface between said first well region and said semiconductor substrate and further a depth of said second well region under the second gate electrode of said second MOS field effect transistor of the second conductive type from the surface of said semiconductor substrate being such that a second depletion layer extending from an interface between the second gate insulating film and said second well region is connected to a depletion layer formed at an interface between said second well region and said third well region.

5. The semiconductor integrated circuit device of claim 4, wherein a field oxide film for isolating elements is formed in said first well region and on said semiconductor substrate; a channel stopper region of the second conductive type is formed in said first well region and under the field oxide film; and the channel stopper region is connected to said third well region.

6. The semiconductor integrated circuit device of claim 5, wherein a channel stopper region of the first conductive type is formed in said second well region adjoining to the channel stopper region formed in said first well region; and a depth of the channel stopper region formed in said second well region from the surface of said semiconductor substrate is shallower than a depth of the channel stopper region formed in said first well region from the surface of said semiconductor substrate.

* * * * *